United States Patent
Bachrach et al.

(10) Patent No.: US 9,529,939 B2
(45) Date of Patent: Dec. 27, 2016

(54) SURFACING ALGORITHM FOR DESIGNING AND MANUFACTURING 3D MODELS

(75) Inventors: Jonathan Bachrach, Berkley, CA (US); Saul Griffith, San Francisco, CA (US)

(73) Assignee: AUTODESK, INC., San Rafael, CA (US)

(*) Notice: Subject to any disclaimer, the term of this patent is extended or adjusted under 35 U.S.C. 154(b) by 1187 days.

(21) Appl. No.: 13/204,534

(22) Filed: Aug. 5, 2011

(65) Prior Publication Data
US 2012/0158369 A1    Jun. 21, 2012

Related U.S. Application Data

(60) Provisional application No. 61/424,016, filed on Dec. 16, 2010.

(51) Int. Cl.
G06F 17/50 (2006.01)
G06T 17/00 (2006.01)
G06T 17/20 (2006.01)

(52) U.S. Cl.
CPC ............ *G06F 17/50* (2013.01); *G06T 17/005* (2013.01); *G06T 17/205* (2013.01)

(58) Field of Classification Search
None
See application file for complete search history.

(56) References Cited

U.S. PATENT DOCUMENTS

2004/0035073 A1* 2/2004 Bravinski .................. 52/426

OTHER PUBLICATIONS

Massarwi et al., Papercraft Models using Generalized Cylinders, Jul. 2007, pp. 1-10.*
Wu et al., ED Part Segmentation Using Simulated Electrical Charge Distributions, Nov. 1997, IEEE, vol. 19 No. 11, pp. 1223-1235.*

* cited by examiner

*Primary Examiner* — Omar Fernandez Rivas
*Assistant Examiner* — Bernard E Cothran
(74) *Attorney, Agent, or Firm* — Artegis Law Group, LLP (57) ABSTRACT

Techniques are described for decomposing three-dimensional (3D) geometry into an assemblable collection of two-dimensional (2D) panels. Importantly, the 3D geometry is automatically encoded into the 2D panels, allowing the 3D geometry to be recreated simply by joining the 2D panels at the appropriate seams and creating the appropriate bends/folds in each panel. Further, each panel has edges, vertices, and faces which can be encoded in the panelization, allowing assembly instructions to be algorithmically generated, Doing so allows users to be provided with a step-by-step instructions carried out to realize the 3D geometry encoded in the 2D panels.

18 Claims, 12 Drawing Sheets

SURFACING ALGORITHM FOR DESIGNING AND MANUFACTURING 3D MODELS

CROSS-REFERENCE TO RELATED APPLICATION

This application claims benefit of U.S. Provisional Patent Application Ser. No. 61/424,016 filed Dec. 16, 2010, which is incorporated herein by reference in its entirety.

BACKGROUND OF THE INVENTION

Field of the Invention

Embodiments presented in this disclosure generally relate to computer aided design (CAD) and computer aided manufacturing (CAM). More specifically, embodiments presented herein provide a surfacing algorithm for designing and manufacturing 3D objects.

Description of the Related Art

CAD/CAM applications provide software modeling tools used to create designs for real-world three-dimensional (3D) objects. For example, a designer may use such a software application to create a 3D model of a constructible toy having a particular shape when inflated. Other examples include 3D computer models of sculpture, furniture, clothing, etc.

Regardless of the underlying object being modeled, a 3D model defines a set of geometry, such as a mesh of triangles or polygons or a set of non-uniform rational basis spines (nurbs), used to represent that 3D object. Once designed, the 3D model provides a template for realizing or manufacturing the modeled object. Typically, a designer manually creates a plan for manufacturing a model from the 3D geometry. For example, assume a 3D model representing an inflatable toy is to be manufactured as a set of cloth panels that may be sewn together. In such a case, the designer may interact with the modeling software to manually derive the shape of each cloth panel from the 3D geometry of the model. That is, the designer may engage in a trial and error process relying on intuition and tailoring skills to determine where to cut the 3D model to create seams of the panels. When sewn together, the resulting panels provide a physical realization of the 3D model. The process is similar for other objects. For example, a designer may identify individual pieces of a sculpture that can be joined using other forms of joinery, e.g., pop rivets used to assemble a metal sculpture from individual pieces of the 3D model.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

SUMMARY

Embodiments presented herein provide techniques for processing 3D graphics data. For example, one embodiment of the invention provides a method for processing three-dimensional (3D) model data that models an object. The method may include comprising, receiving, by a software application stored in a memory and executed on a processor, a set of 3D geometry elements that model the object. This method also includes decomposing the 3D geometry elements into a collection of one or more two-dimensional (2D) panels. Each 2D panel encodes a distinct portion of the 3D model data of the object.

The 3D geometry elements may be, e.g., a mesh of triangles within a 3D coordinate space. In such a case, decomposing the 3D geometry elements into a collection of one or more 2D panels may include representing each triangle in the mesh of triangles as a different 2D panel and identifying potential mergings of pairs of 2D panels that share a common edge in the 3D geometry. Then, for each potential merging, a cost (or objective) function is evaluated to assign a number based on geometric properties of the 2D panel that would result from a given potential merging. One of the potential mergings is then selected to be performed, growing a given panel. That is, the two panels (one or both of which may be a single triangle) are merged. This process may generally be repeated until termination criteria are satisfied.

In a particular embodiment, the potential mergings are filtered to remove ones that cannot be projected into a 2D plane without the resulting panel overlapping or intersecting itself and/or to remove potential mergings according to a material or manufacturing constraint. Each 2D panel may encode a distinct portion of the 3D model data of the object as a tree. The tree itself encodes the 3D geometry of each element merged into a given 2D panel.

Other embodiments include, without limitation, a computer-readable storage medium that includes instructions that enable a processing unit to implement one or more aspects of the disclosed methods as well as a system having a processor, memory, and application programs configured to implement one or more aspects of the disclosed methods.

DETAILED DESCRIPTION

Embodiments presented herein provide techniques for decomposing three-dimensional (3D) geometry into an assemblable collection of two-dimensional (2D) panels. Importantly, the 3D geometry is automatically encoded into the panels, allowing the 3D geometry to be recreated simply by joining the panels at the appropriate seams and creating the appropriate bends/folds in each panel. For example, each panel has edges, vertices, and faces which can be algorithmically encoded, resulting in an assembly process resembling a "paint by numbers" approach. In particular cases, the assembly process is geometrically encoded into the components such that they can only assemble into the "correct" target 3D geometry, e.g., in cases where the only compatible seams for joining any pair of panels are the correct ones. These cases may be used to design and manufacture puzzles provided as a set of 2D panels, where the goal of the puzzle is to discover the unique joining of the panels that results in a given 3D shape.

More generally, embodiments of the invention provide techniques for generating a "coded assembly" or "coded manufacturing plan" for assembling a 3D object from a collection of 2D panels, where the panels encode the 3D geometry. In one embodiment, a software tool implements a process for decomposing the 3D geometry into the collection of 2D panels. Such a software tool may receive arbitrary 3D geometry from a CAD program and automatically reduce that geometry into a panelization (i.e., a set of 2D panels). The panelization itself defines a set of manufacturable pieces. For example, the software tool may receive a 3D mesh of triangles and produces 2D vector files describing the nested flat parts, including the part numbers, bend lines, angles and joinery needed to assemble the flat parts into the 3D object. Thus, the "coded assembly" process converts the 3D fabrication process into a "design at a high level," approach where fabrication is reduced to simply "painting by numbers." That is, the automatic assembly instruction generation allows comprehensive assembly and building plans to be generated directly from the panelization. More than just blueprints, the assembly instructions may provide a step by step "join A then B then C then D" set of instructions performed to realize the 3D model.

Further, the decomposition process can account for both material and machine constraints of the end manufacturing process. That is, the panelization can account for the bend and joinery mechanisms used for a particular material type and desired look such as pop rivets, welded seams, and press fit. The software tool creates the opportunity to greatly reduce the time to design and manufacture parts for a 3D assembly as well as provides a distinct algorithmic design quality that may be tailored for use with a variety of materials and tools, including, e.g.:

paper—scissors, knife, etc.
fabrics—scissors, shears, knife, etc.
wood—scroll-saw, band-saw, knife, hack-saw, jig-saw, etc.
metal—snips, shears, band-saw, etc.
plastic—knife, scissors, etc.
other—virtually anything that can be rendered in sheet format Additionally, because the algorithms decompose 3D geometry into flat 2D panels encoding the 3D structure, the panels (and assembly instructions) can be printed on paper (or printed on other sheets of construction material), allowing a much broader set of people to participate in digital design. That is, with printed plans automatically generated from their 3D modeling, a user may build the 3D model from the printed paper or use the panelization and assembly instructions as precision templates for creating 2D panels from other materials.

Further still, in one embodiment, users may extend the software tool to derive a panelization for 3D geometry that accounts for a broad variety of manufacturing concerns may be present in a particular case, e.g., relative to an intended joinery technique, material type, stock thickness, machine tool, or desired panel characteristics.

Note, the following description is presented to enable one of ordinary skill in the art to implement, make and use the proposed techniques. Descriptions of specific embodiments and applications are provided only as examples and various modifications will be readily apparent to those skilled in the art. The general principles described herein may be applied to other embodiments and applications without departing from the scope of the disclosure. Thus, the present disclosure is not to be limited to the embodiments shown, but is to be accorded the widest scope consistent with the principles and features described herein. For purpose of clarity, the following description does not describe in detail features relating to technical material known in the arts related to the proposed ideas.

Figure 1A:
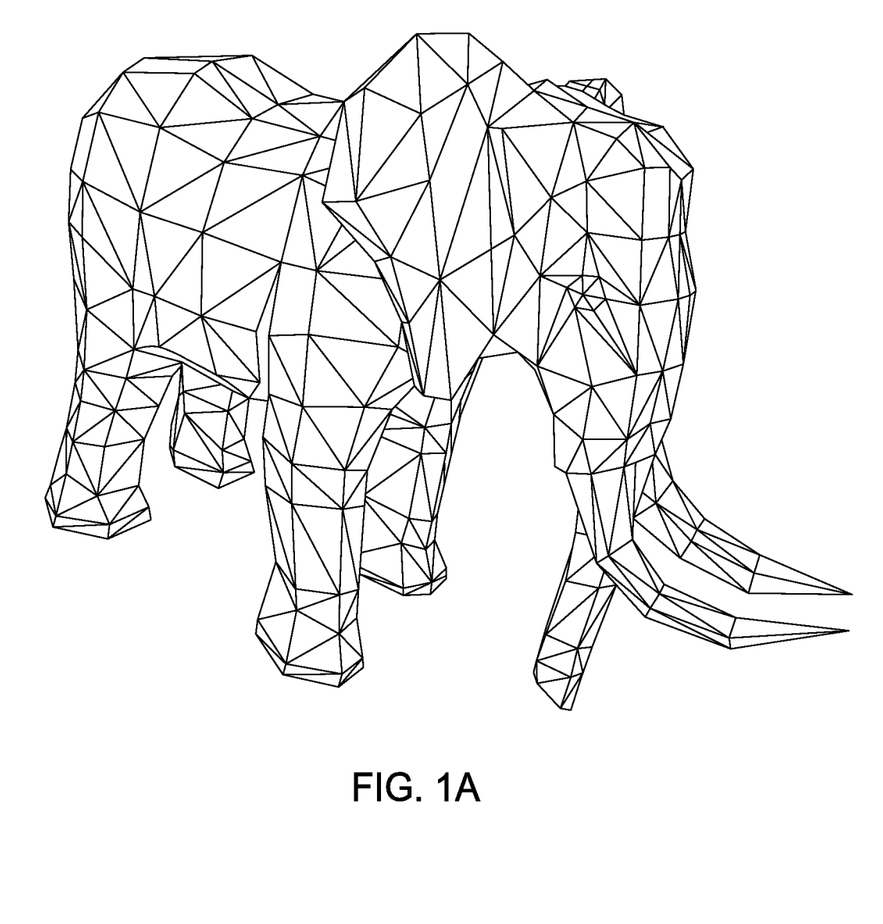
FIG. 1A illustrates an example 3D geometry mesh modeling an object, according to one embodiment of the invention.

FIG. 1A illustrates an example 3D geometry mesh 100 modeling an object, according to one embodiment of the invention. Illustratively, the 3D geometry mesh 100 provides a graphical model of an elephant composed from a collection of triangles in a 3D coordinate space. In one embodiment, a 3D model, such as 3D geometry mesh 100, may be decomposed into a set of 2D panels by merging triangles present in the 3D geometry. As described in greater detail below, which panels are merged, and how many panels are generated, may be determined relative to a cost (or objective) function which iteratively selects panels to merge until reaching some termination criteria (or until no more panels may be merged according to the constraints being used in a particular run of the decomposition process). Additionally, which panels may be merged may be limited to ones which result in a panel which may be flattened without folding or otherwise intersecting itself. Note, without loss of generality, the following description generally refers to cost functions.

Figure 1B:
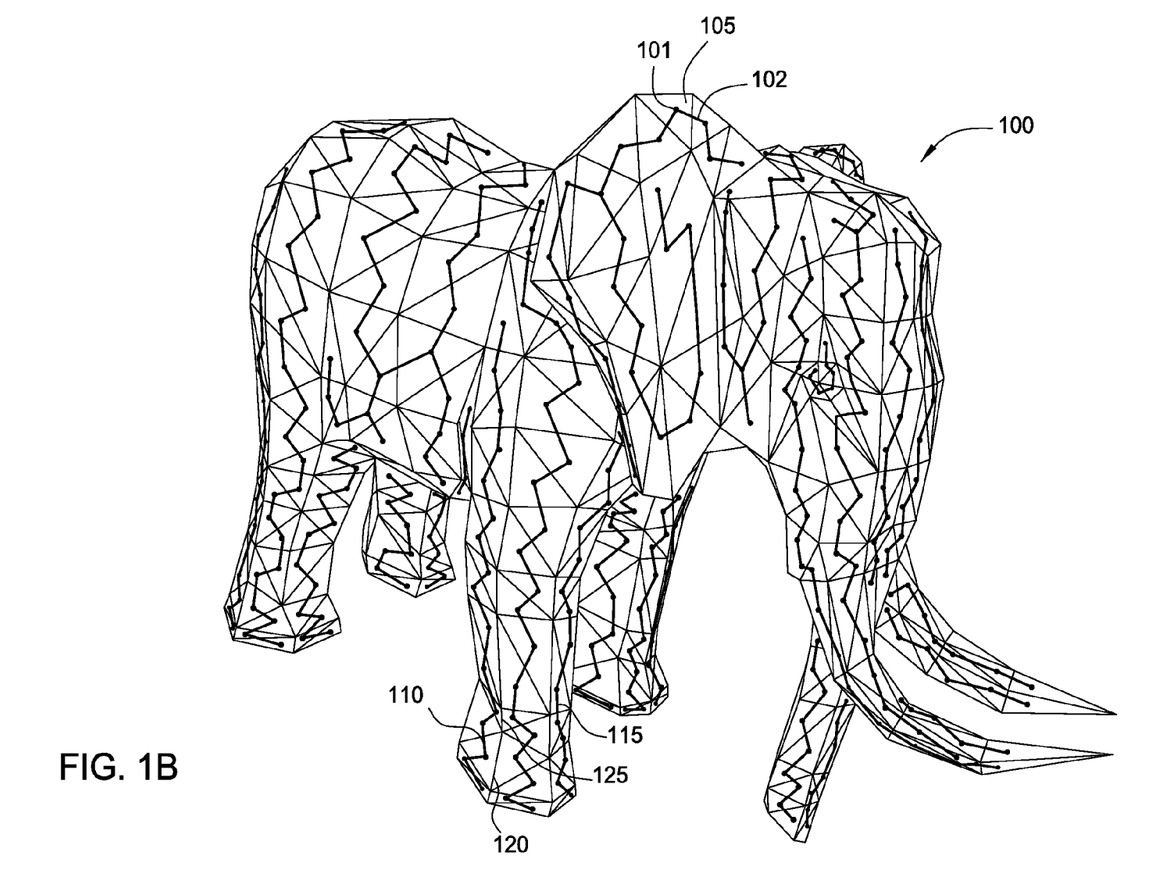
FIG. 1B illustrates an example collection of trees which merge groups of triangles of the 3D geometry shown in FIG. 1 into panels, according to one embodiment of the invention.

In one embodiment, each panel is represented as a tree, with new nodes added to the there as additional triangles are merged into a given panel. For example, FIG. 1B illustrates an example collection of trees merging groups of triangles of the 3D geometry mesh 100 shown in FIG. 1, according to one embodiment of the invention. Each tree corresponds to a flat 2D panel in the panelization of 3D geometry mesh 100 (that does not overlap or otherwise intersect itself). For example, a tree 105 includes a set of nodes 101 and branches 102, where each node is centered within one of the triangles of the mesh 100 and includes branches to other triangles that have been merged into the panel corresponding to tree 105. Note, generating trees from merged triangles results in a binary tree, where a given node can have a parent (one side of the triangle) and at most two children (the other two sides of the triangle).

Further, cutting the non-connected edges of triangles in the mesh 100 results in the 2D panelization of the 3D geometry. For example, cutting edge 120, 125, and other non-connected edges up the left-front "leg" of the elephant separates a panel corresponding to tree 110 from the panel corresponding to tree 115. Separating all the non-connected edges provides the collection of panel pieces. Further, each panel encodes a corresponding portion of the 3D geometry. For example, the edge length, bend angle and size of each triangle merged into a panel may be encoded into the data representing that panel. Thus, when the panels are printed, they may include the appropriate scoring with printed lines and bend angles, as well as markings indicating how to connect the seams between panels in order to realize the 3D model as a physical object.

Figure 1C:
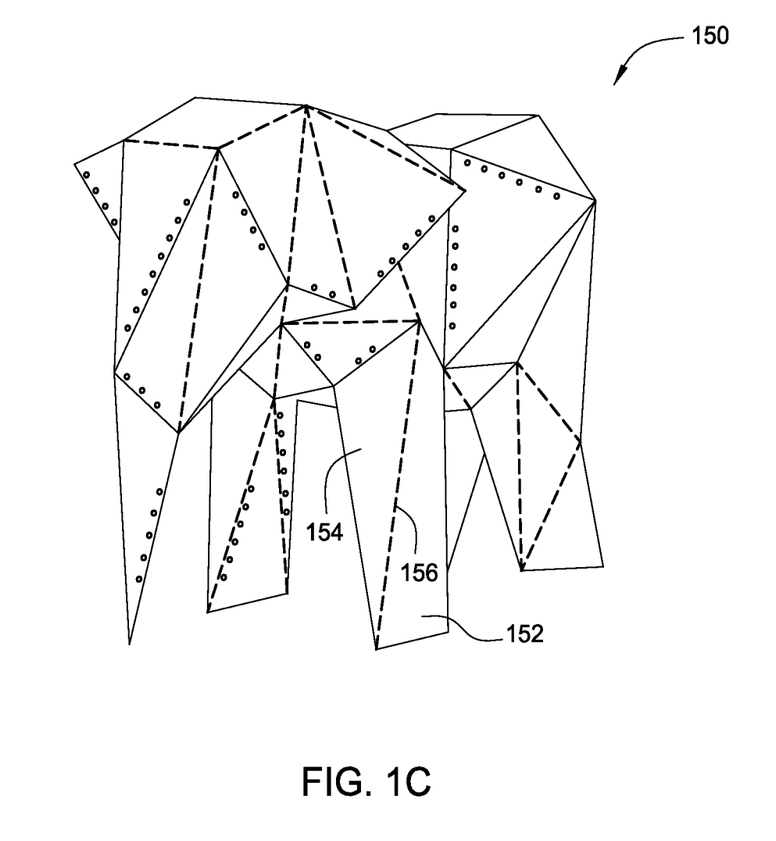
FIG. 1C illustrates an example model constructed from a flat set of 2D panels, according to one embodiment of the invention.

For example, FIG. 1C illustrates an example model 150 constructed from a flat set of 2D panels, according to one embodiment of the invention. In this example, the elephant is realized by joining each flat panel to another at the appropriate seams. For example, the right front leg of the elephant includes a panel 152 and a panel 154 joined at seam 156. Note, in this example, each panel is joined as a generally flat shape resulting in some loss of detail in the resulting physical model 150 relative to the original 3D mesh. As noted, however, each panel may be encoded with the appropriate bends and folds needed to restore the exact or near-exact geometry of the original 3D model in the physical realization.

Figure 2:
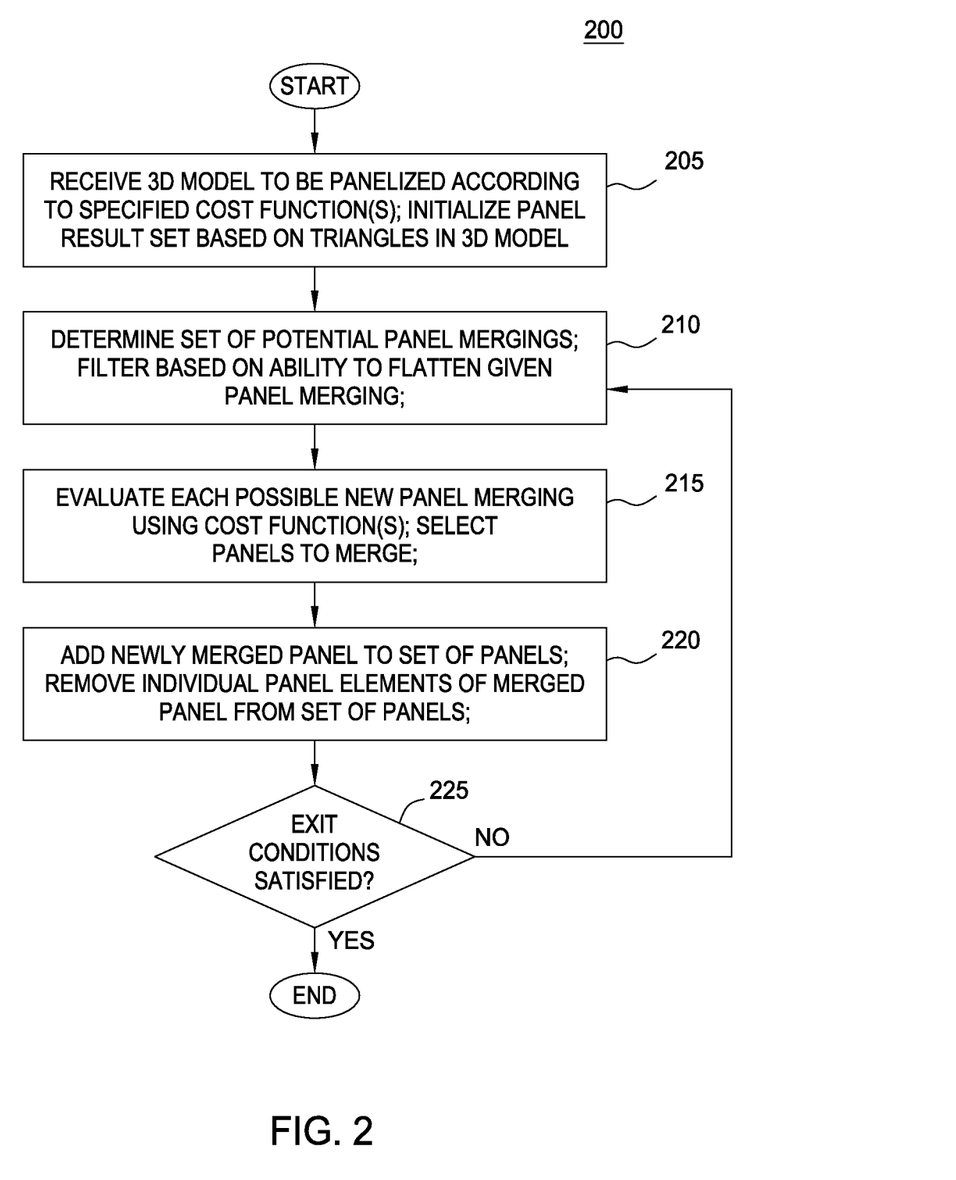
FIG. 2 illustrates a method for decomposing a collection of 3D geometry into a collection of 2D panels, according to one embodiment of the invention.

FIG. 2 illustrates a method 200 for decomposing a collection of 3D geometry into a collection of 2D panels, according to one embodiment of the invention. Persons skilled in the art will understand that any system configured to perform the steps of the method illustrated in FIG. 2, in any order, is within the scope of the present invention. Also note, for purposes of discussion only, the method 200 is described relative to the following example pseudocode implementation:

TABLE 1

Panel Decomposition Pseudocode

```
1  panels := {triangles}
2  do {
3    poss_new_panels := determine all ij panel_i mergeable+flattenable
     with panel_j
4    if (|poss_new_panels| > 0) {
5      new_panel := min(panel_cost (poss_new_panels))
6      panels := (panels − child_one(new_panel) − child_two(new_panel) +
       new_panel)
7    }
8  } until |mergings| == 0 or |mergings| == target_num
```

As shown, the method 200 begins at step 205, where the panel decomposition process receives a 3D model to be panelized. The panelization process may be configured to receive a set of 3D model geometry using a format of a given CAD modeling tool (e.g., as a .DWF, .DWG, or open CAD XML file, etc.). Further the panelization process may be initialized to use a particular cost function to evaluate panels for merging based on measurable geometric properties of the triangles (and the resulting panel mergings) present in the 3D model and based on any material, process, or joinery constraints that should be followed for a particular case At step 205, the panel decomposition process initializes the set of panels to equal the complete set of triangles present in the 3D model (as shown in line 1 of the pseudocode shown in Table 1). That is, the initial set of panels includes each individual triangle in the 3D panel as a distinct panel. From here, a loop begins (lines 2-8 of the pseudocode) where panels are merged according to a set of mergeability constraints, until no further mergings are possible or until any termination criteria are satisfied.

At step 210, the panel decomposition process determines a set of potential panel mergings. In one embodiment, this may include identifying each pair wise combination of panels that share a common edge. Once identified, possible mergings that fail to meet panelization constraints may be filtered out. For example, panels are removed that, if merged, would result in a panel that overlaps or intersects itself when the 3D geometry is projected into a 2D plane. That is, mergings which result in a panel that cannot be flattened without intersections or overlaps are discarded from the set of possible new panels. Further, the set of potential new panels may also be filtered to remove panels that are not "mergeable" based on any other constraints related to the joinery, materials, construction, or printing of the panels being generated (or based on any other constraints relevant in a particular case). For example, example, a metal sheet may need to have a minimum surface area before a machine can introduce a bent fold into the metal sheet. Similarly, such a machine may have a maximum bend angle that can be introduced into a flat sheet. A bend angle between two triangles that exceeds this maximum is filtered from the set of potential panel mergings. In practice, such edges instead become a boundary or seam between panels merged using some form of joinery depending on the underlying construction material (e.g., pop rivets or a joining tab or sewing). Similarly, the joinery used in a particular case may require a minimum amount of additional surface area along the perimeter of two seams in order for two fabric panels to be joined together. Note, step 210 is reflected in the line 3 of the pseudocode shown in Table 1.

Provided some elements remain in the set of possible new panel mergings (tested at line 4 of the pseudocode), then at step 215, each element in the set of possible new panel mergings is evaluated using the cost function being used in order to assign a real number (i.e., a score) to each possible new panel based on measurable geometric properties of the panel geometry. For example, the cost function may be configured to merge panels in order to maximize/minimize the surface area of the panels, maximize/minimize the perimeter length of the panels, maximize/minimize the number of panels that are created, or to create panels having a particular preferred flattened shape or 3D topology, etc. Of course, one of ordinary skill in the art will recognize that a broad variety of cost functions may be used in a particular case. Further, in one embodiment, users may compose additional cost functions used to decompose a set of 3D geometry in order to create panelizations having desired geometric (or other) characteristics.

In the example pseudocode of FIG. 1, at line 5, a new panel is generated using the possible panel merging having the minimum cost, as determined by the panel_cost function. Note, in this example, a new panel is always merged. As an alternative, however, the lowest cost score may be required to fall below a specified threshold (or exceed a threshold in the case of an objective function) before a merging occurs. Similarly, if two (or more) panels share an equal cost, one may be selected at random. Alternatively, the decomposition process could be forked, allowing multiple solutions to be generated along different decomposition paths.

At step 220, once a merged panel is selected, that panel is added to the overall set of panels representing the 3D geometry and the pair wise panels that were merged are removed from the set of panels, as shown at line 6 of the pseudocode. At step 225, after the new panel is merged, the panel decomposition process determines whether any exit criteria have been satisfied prior to beginning another pass through the loop (and attempting to merge another pair of panels). For example, the decomposition process may continue so long as a possible merging remains or until a target number of mergings has occurred, as shown at line 8 of the pseudocode. Of course, other termination criteria could be used depending on the needs of a particular case.

The method shown in FIG. 2 (and implemented in the pseudocode of Table 1) generally follows a "greedy" approach, where the locally optimal choice is selected during each iteration of the loop. As is known, this approach can lead to poor overall solutions in cases where a given—locally optimal—choice precludes an overall superior solution from being obtained. Accordingly, in one embodiment a "restart" approach may be used to help improve the initial panelization. For example, once the initial panelization is generated, a specified number of panel mergings are selected at random and "cut." The method 200 may then be "restarted" using the resulting set of panels and ran again until completion (or until N tries has occurred). If the resulting panelization is superior (as determined relative to some objective or cost function for evaluating the panelization as a whole), then that solution is kept. The "restart" approach is then applied to the improved panelization. Otherwise, if the original panelization is superior to the one created through the "restart," then the "restart" approach is applied again to the initial panelization until an improvement is obtained. This "restart" process can be applied iteratively to the panelizations to monotonically improve the solution quality of the panelization.

As another alternative, some randomness may be introduced into the method 200. For example, the cost function may be configured to select the "best" possible merging with some probabilistic frequency (say 90%) and select the second best (or third, etc.) possible merging otherwise. Similarly, the results of the "greedy" approach can depend heavily on the starting point (in this context, on the first selected merging of two triangles). Accordingly, in one embodiment, the method 200 may be executed concurrently using the same 3D geometry but with a different initial panel merging, and the resulting panelizations can be evaluated for quality as well as improved using the "restart" process.

Figure 3A:
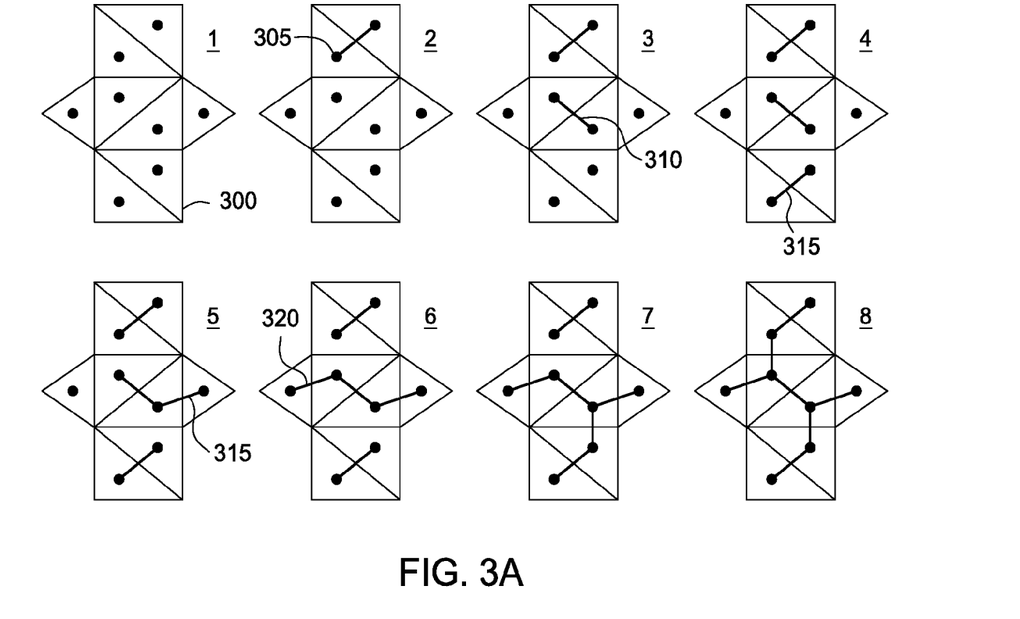
FIGS. 3A-3B illustrate trees being constructed to panelize a specific triangle mesh using different cost functions, according to one embodiment of the invention.
Figure 3B:
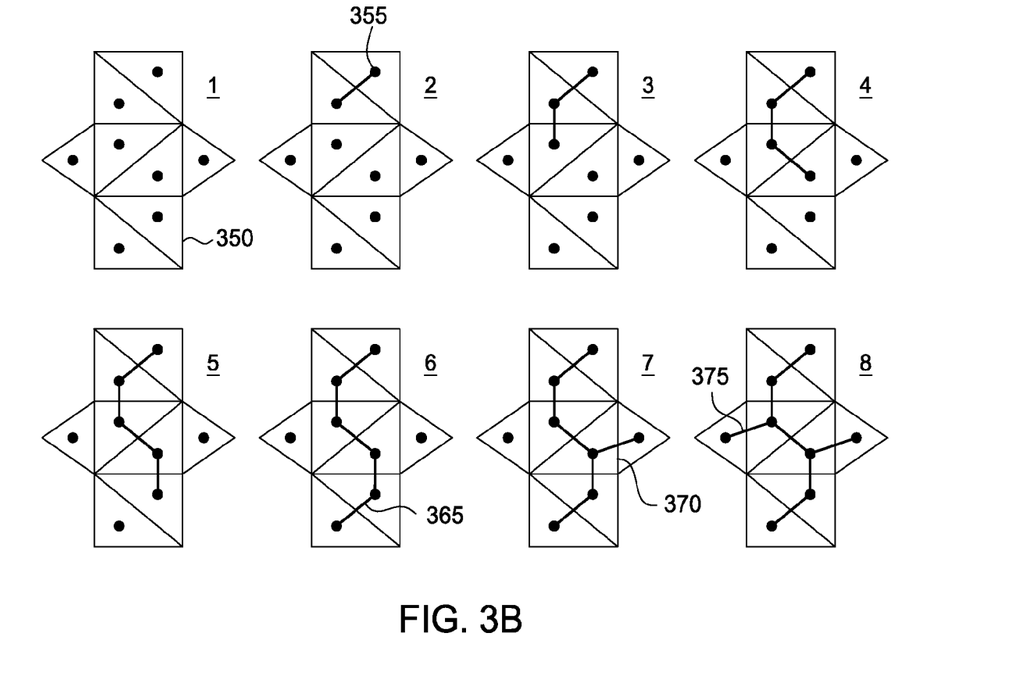

FIGS. 3A-3B provide examples of the panel decomposition process performed using the method 200. More specifically, FIGS. 3A-3B illustrate trees being constructed to panelize a specific triangle mesh using different cost functions, according to one embodiment of the invention. FIG. 3A illustrates a panelization where the cost function is configured to minimize the size growth of each individual panel. That is, the cost function will select to create a new panel (merging two single-triangle panels) over growing an existing multi-triangle panel and select to grow a panel with a fewer number of nodes over growing a panel with a larger number of nodes. Ties may be broken randomly.

As shown, geometry 300 begins with no mergings (at step 1) and runs from steps 2-8, merging two panels at each step. For example at step 2, two adjacent panels are merged, creating a tree 305 with a single branch At steps and 3 and 4, trees and 315 and 320 are created, respectively, each having a single branch. At step 5, no further single branch mergings are possible, resulting in one of the existing trees being grown. In this particular example, the tree 305 is grown to include branch 315. Similarly, at step 6, branch 320 is added to tree 305, resulting in a largest tree having four nodes. This branch is chosen as the other possible mergings would result in a tree with five nodes. The decomposition process continues in this example to steps 7 and 8, resulting in a single panel panelization for the geometry 300.

FIG. 3B provides another example panelization of an input geometry. In the example of FIG. 3B, the cost function is configured to favor extending the length of branches in existing trees over creating new ones. As shown, like geometry 300 of FIG. 3A, geometry 350 begins with no mergings (at step 1) and runs from steps 2-8, merging two panels at each step. For example, at step 2, two adjacent panels are merged, creating a tree 355 with a single branch. At steps 2-6, the branch of tree 355 is extended to a length of five branches, with a branch 365 added at step 6. At this point, the single branch cannot be extended further. Accordingly, at step 7 and 8, branches 370 and 375 are added to tree 355, respectively, completing the panelization of geometry 350.

Note, while the final panelizations of geometry 300 and 350 are the same when run to completion (step 8 in FIGS. 3A and 3B), this occurs as a result of the relatively simple geometry of shown in these figures, where each possible merging between panels occurs. In more complicated 3D geometry, some possible mergings would likely be filtered out as not being "flattenable" or due to other "mergeability" constraints, as discussed above. However, even for geometry 300 and 350, if termination conditions limited the number of panel mergings to five (occurring at step 6 of FIGS. 3A-3B), then different panelizations result from the use of different cost functions. For example, step 6 of FIG. 3A includes a panelization that includes two square panels joined to one large diamond shaped panel, where step 6 of FIG. 3B includes one large rectangular panel along with two single-triangle panels on either side. This illustrates how the selected cost function can change the panelization generated for a given set of input geometry.

Figure 4A:
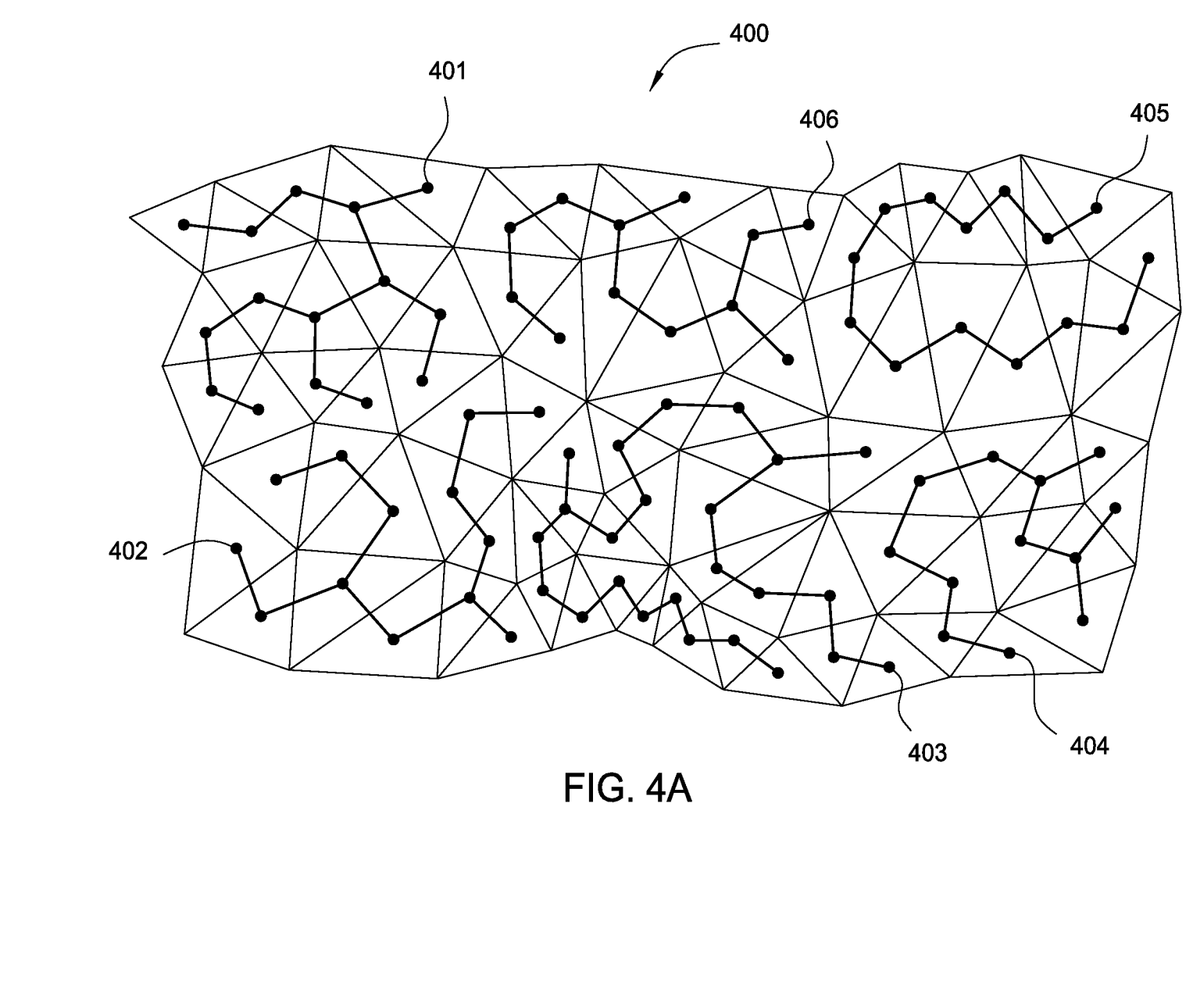
FIGS. 4A-4D illustrate example panelizations of a 3D triangle mesh generated using different cost functions, according to one embodiment of the invention.

FIGS. 4A-4D illustrate example panelizations of a 3D triangle mesh generated using different cost functions, according to one embodiment of the invention. First, FIG. 4A illustrates a set of 3D geometry—mesh 400—panelized using a cost function that minimizes the size of the resulting panels. In this example, the decomposition process has resulted in six panels being generated. As shown, each panel is represented using a tree 401-406 that connects each triangle merged into a given panel. As described, the decomposition process ensures that the panels may be flattened, allowing each panel to be printed or otherwise created using a flat material component (e.g., a sheet of paper, wood, metal, fabric, etc.). Further, trees 401-406 each encode a portion of the 3D geometry of the mesh 400. That is, trees 401-406 corresponding to a given panel encodes the edges, vertices, faces, and seams of that panel. Thus, trees 410-406 encode the information needed to physically realize the 3D model corresponding to mesh 400 from the 2D panelization.

Figure 4B:
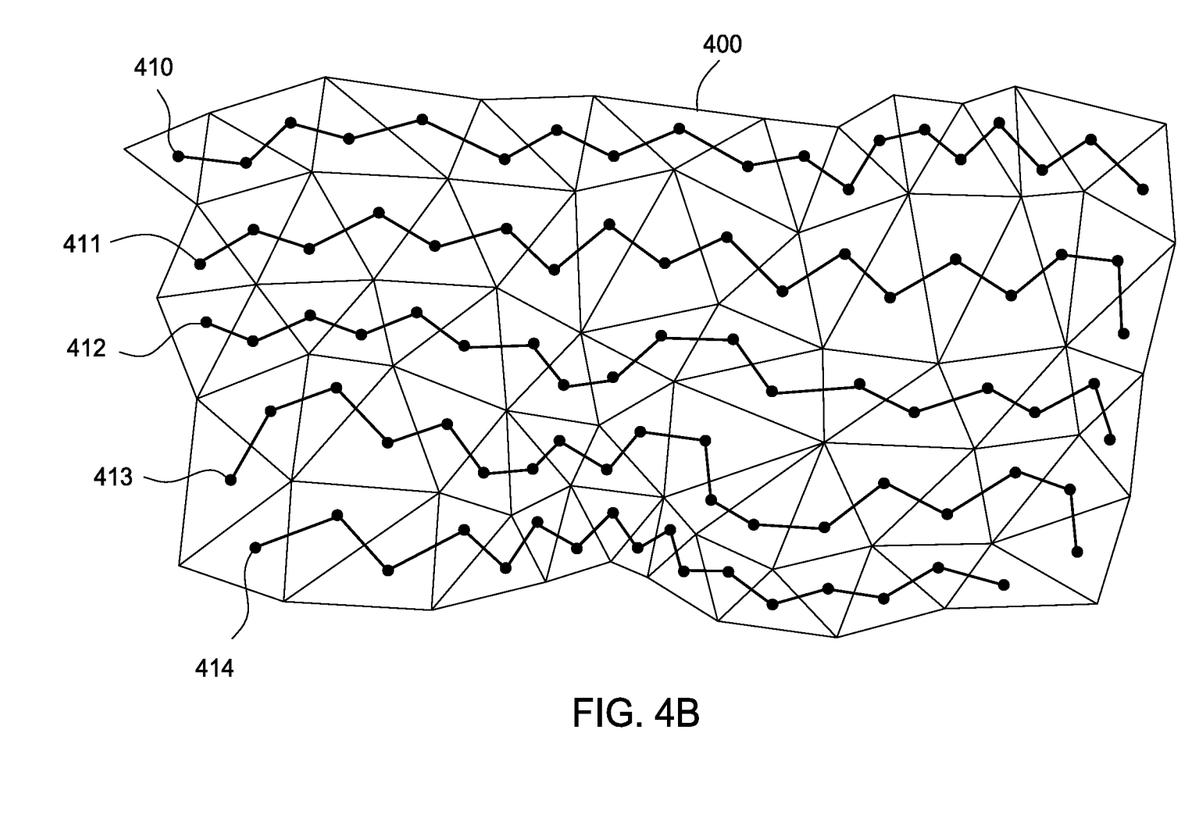

FIG. 4B illustrates another example panelization of mesh 400. Illustratively, mesh 400 is panelized using a cost function that favors mergings which result in "strips" of triangles. That is, the cost function favors panel mergings that extend the length of a tree having a single branch over creating branched trees. As a result, the panelization of mesh 400 includes five strip-shaped panels, represented using trees 410-414. Again, each tree 410-414 encodes the information needed to physically realize the 3D model corresponding to mesh 400, but does so using a different panelization from the one shown in FIG. 4A.

Figure 4C:
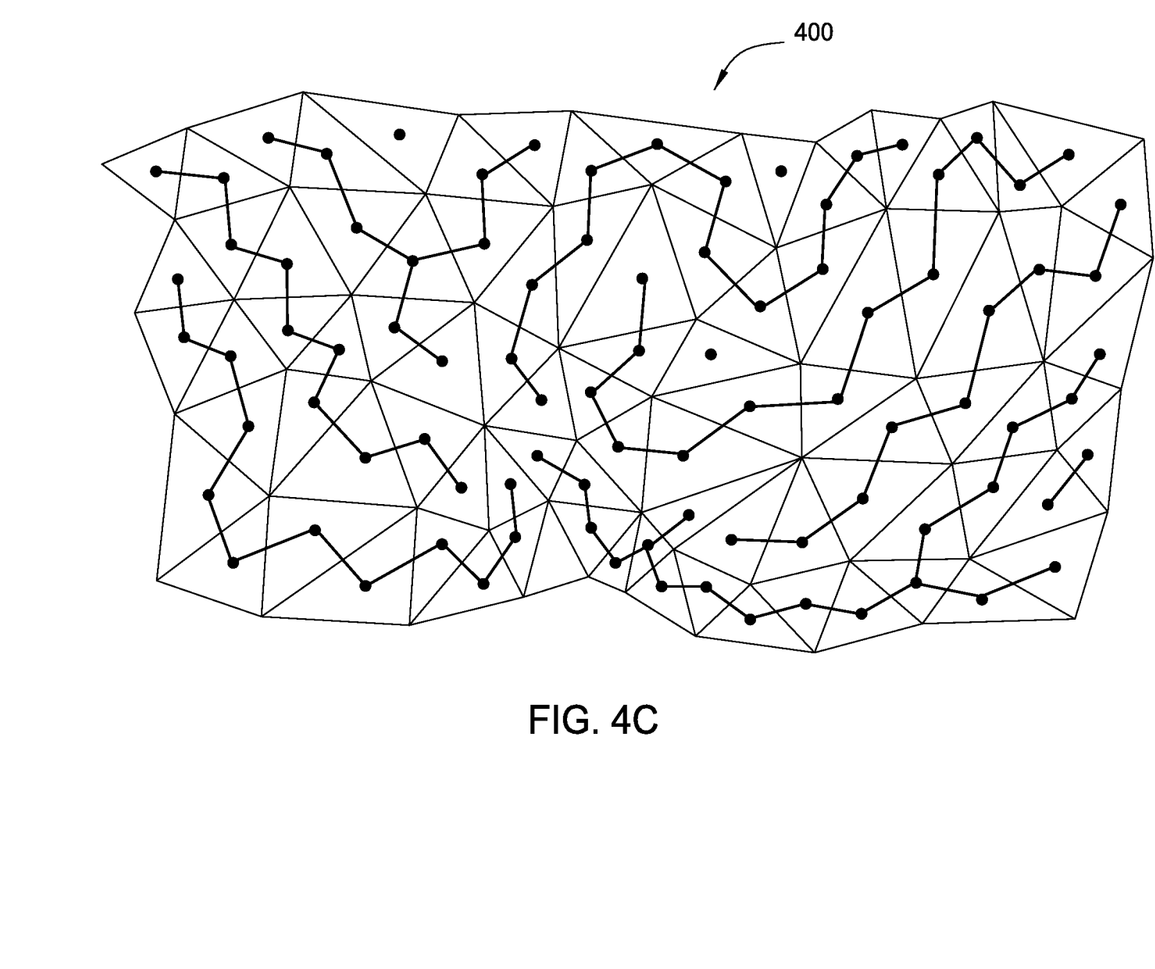

FIG. 4C illustrates yet another example panelization of mesh 400. Illustratively, in FIG. 4C, mesh 400 is panelized using a cost function that favors large boundary sizes between panels. That is, the cost function used to panelize mesh 400 in FIG. 4C maximizes the length of seams between different panels in the resulting panelization. As a result, the panelization of mesh 400 includes ten different panels, including two single-triangle panels, used to represent mesh 400 Again, like the trees in FIGS. 4A and 4B, the trees in this panelization encode the information needed to physically realize the 3D model corresponding to mesh 400, but does so using a different panelization from the one shown in FIGS. 4A-4B.

Figure 4D:
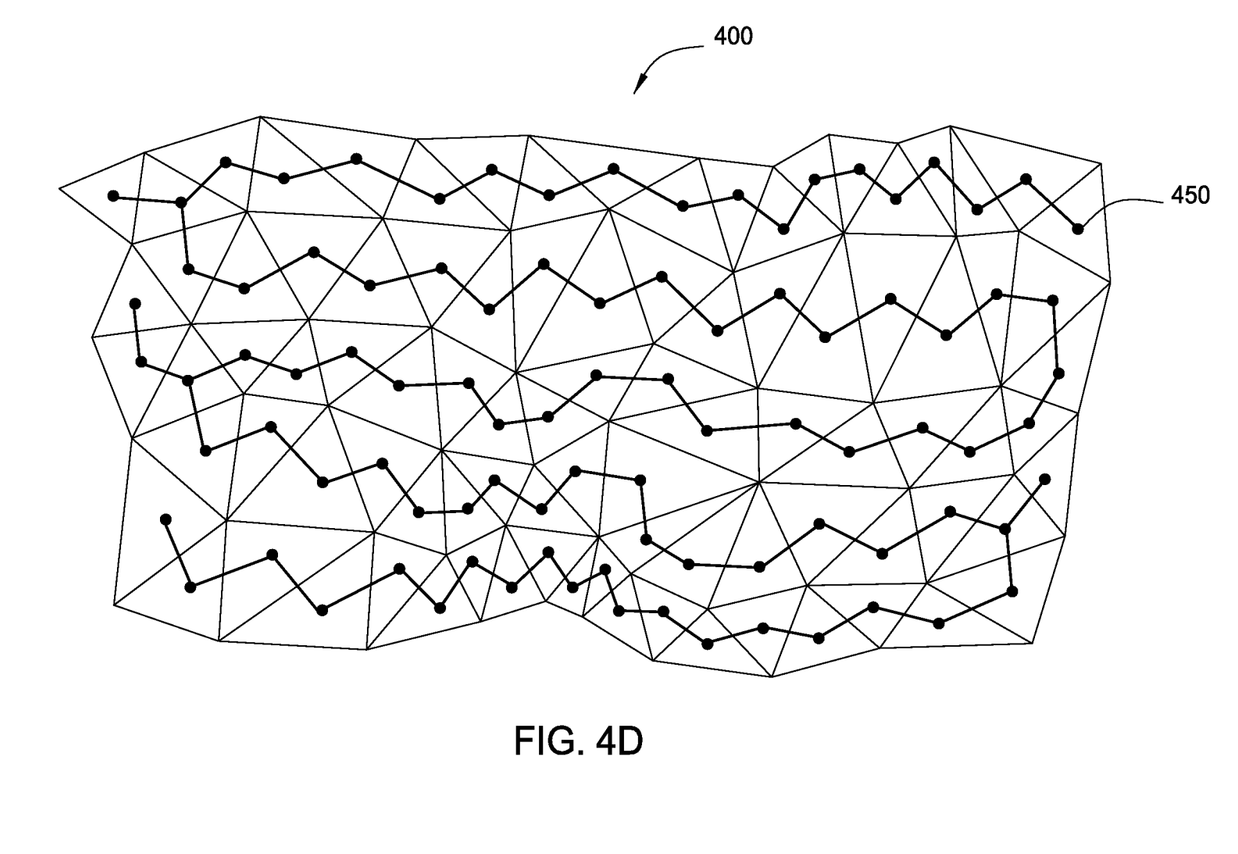

Lastly, FIG. 4D illustrates another example panelization of mesh 400. The cost function used to create this panelization is configured to create a panelization that results in a spanning tree for the underlying 3D geometry. Thus, unlike the panelizations shown in FIGS. 4A-4C, the decomposition of mesh 400 shown in FIG. 4D results in a single 2D panel. Specifically a spanning tree 450 provides a single panel that includes each triangle in the mesh 400. Thus, traversing the tree 450 will visit every triangle in mesh 400. Doing so allows a set of assembly instruction encoded in the panelization to be generated algorithmically. Such assembly instructions could specify the edges, vertices and relative angles between for each triangle present in mesh 400, allowing the 3D geometry to be realized from a single, 2D panel. More generally, the tree corresponding to a given panel encodes the 3D geometry for that panel. Thus, traversing the trees generated during a given panelization allow a set of assembly instruction of panels to be determined algorithmically.

Figure 5:
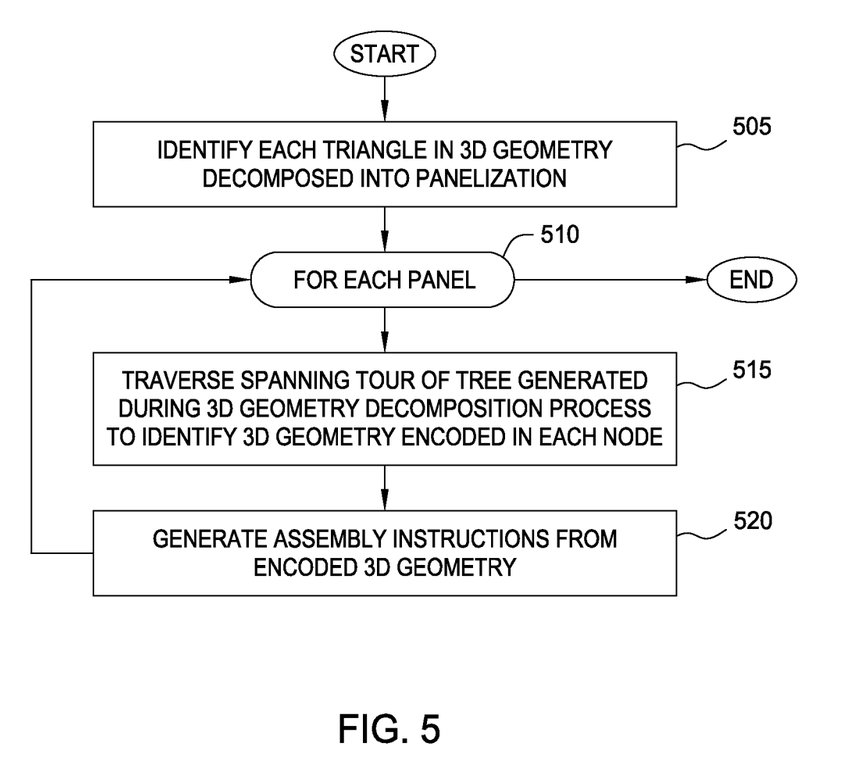
FIG. 5 illustrates a method for generating a set of assembly instructions encoded in a panelization of a 3D triangle mesh, according to one embodiment of the invention.

FIG. 5 illustrates a method 500 for generating a set of assembly instructions encoded in a 2D panelization of a 3D triangle mesh, according to one embodiment of the invention. Persons skilled in the art will understand that any system configured to perform the steps of the method illustrated in FIG. 5, in any order, is within the scope of the present invention.

As shown, the method 500 begins at step 505, where each triangle and panel in a 3D mesh is labeled. For example, each triangle and each panel may be assigned a distinct triangle number and panel number.

Once labeled, a loop begins at step 510 where the panels in a 2D panelization are evaluated to derive a set of assembly instructions performed to realize the 3D geometry encoded in the 2D panelization. At step 515, a tree corresponding to a given panel is traversed using a spanning tour. As described below in conjunction with FIG. 6, the spanning tour is used to traverse a set of triangles associated with a given panel, where each triangle is visited exactly once during the tour. Doing so allows a set of assembly instructions to be created for each panel algorithmically (step 520). For example, beginning with a first panel, a spanning tour is traversed. At each node of the spanning tour, a set of assembly instructions can be created for that node, resulting in a step-by-step set of instructions for realizing the 3D geometry encoded in the nodes of the first panel. The order of the step-by-step instructions generally coincides with the order in which nodes of the tree are visited during the spanning tour of the first panel.

Once the instructions for the first panel are generated, another panel in the 2D panelization may be selected and steps 515 and 520 may be repeated. Further, the instructions may include steps for joining the panels together. That is, the instructions may indicate an edge in one panel that should be joined to a specific edge in another panel in order to realize the 3D geometry of the overall mesh.

Figure 6:
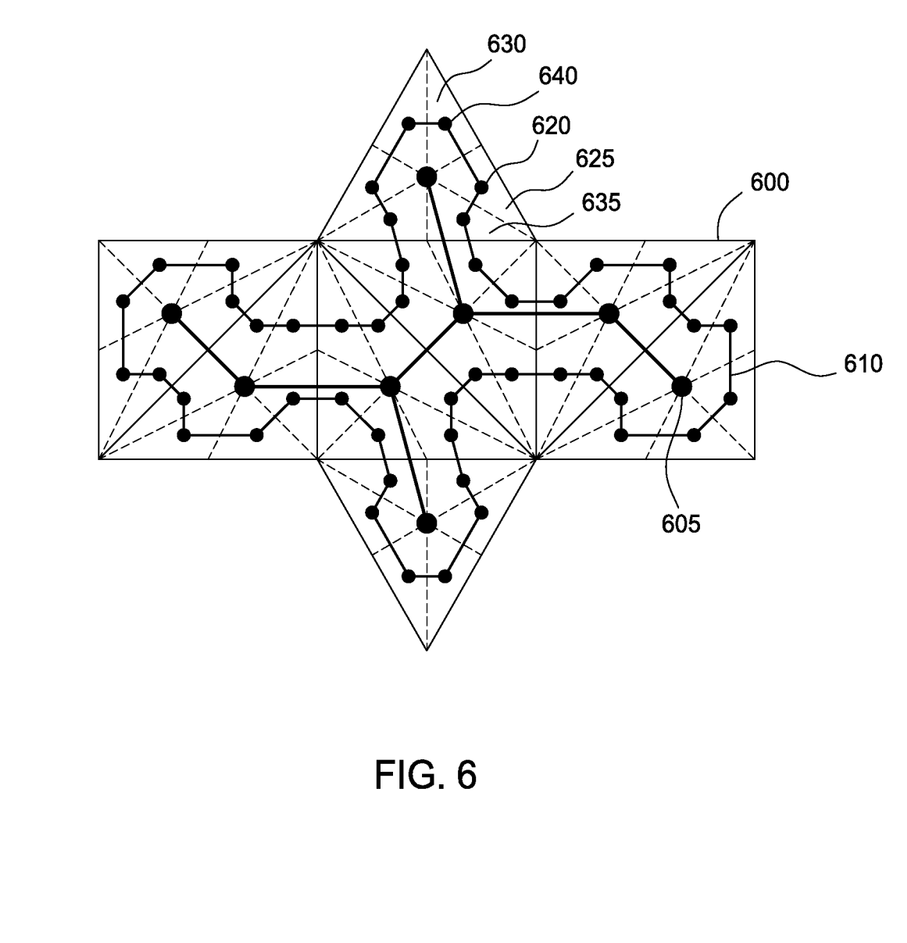
FIG. 6 illustrates a spanning tour of a panelization of a 3D triangle mesh, according to one embodiment of the invention.

FIG. 6 illustrates a spanning tour 610 of a panelization of a triangle mesh 600, according to one embodiment of the invention. The triangle mesh 600 includes a tree 605 generated by panelizing the mesh 600 using the techniques described above. For example, the panelization shown in FIG. 6 corresponds to the results of the decomposition process shown in FIG. 2 using the geometry and cost functions of either FIG. 3A or 3B. Thus, the decomposition results in a decomposition of mesh 600 that includes a single panel. The decomposition also results in a tree 605 encoding the geometry of mesh 600.

Illustratively, each triangle in the mesh 600 is subdivided into six sub-triangles by connecting the center point of each respective triangle in the mesh 600 to the vertices and centers of each edge of that triangle—shown in FIG. 6 using dashed lines. The center points of the sub-triangles provide points for a spanning tour 610 that visit each sub-triangle exactly once. For example, consider the center point 620 of sub-triangle 625. From this center point, a path may be traversed to the center point of exactly two other sub-triangles without intersecting tree 605 (specifically, for sub-triangle 625, sub-triangles 630 or 635). The same relation exists for every sub-triangle in mesh 600. Thus, the spanning tour 610 could start at the center point of any of the sub-triangles. Once a path is selected, e.g., a path from center point 620 to center point 640, the remaining path of the spanning tour 610 can be determined by traversing from the current point to the next un-visited center point of the sub-triangles, until the spanning tour 610 loops back on itself and reaches center point 620. Note, this process ensures that each sub-triangle is visited during the spanning tour 610 exactly once, which allows the appropriate step-by-step instructions for realizing the 3D geometry encoded by tree 605 to be generated algorithmically during the spanning tour of panel 600.

Figure 7:
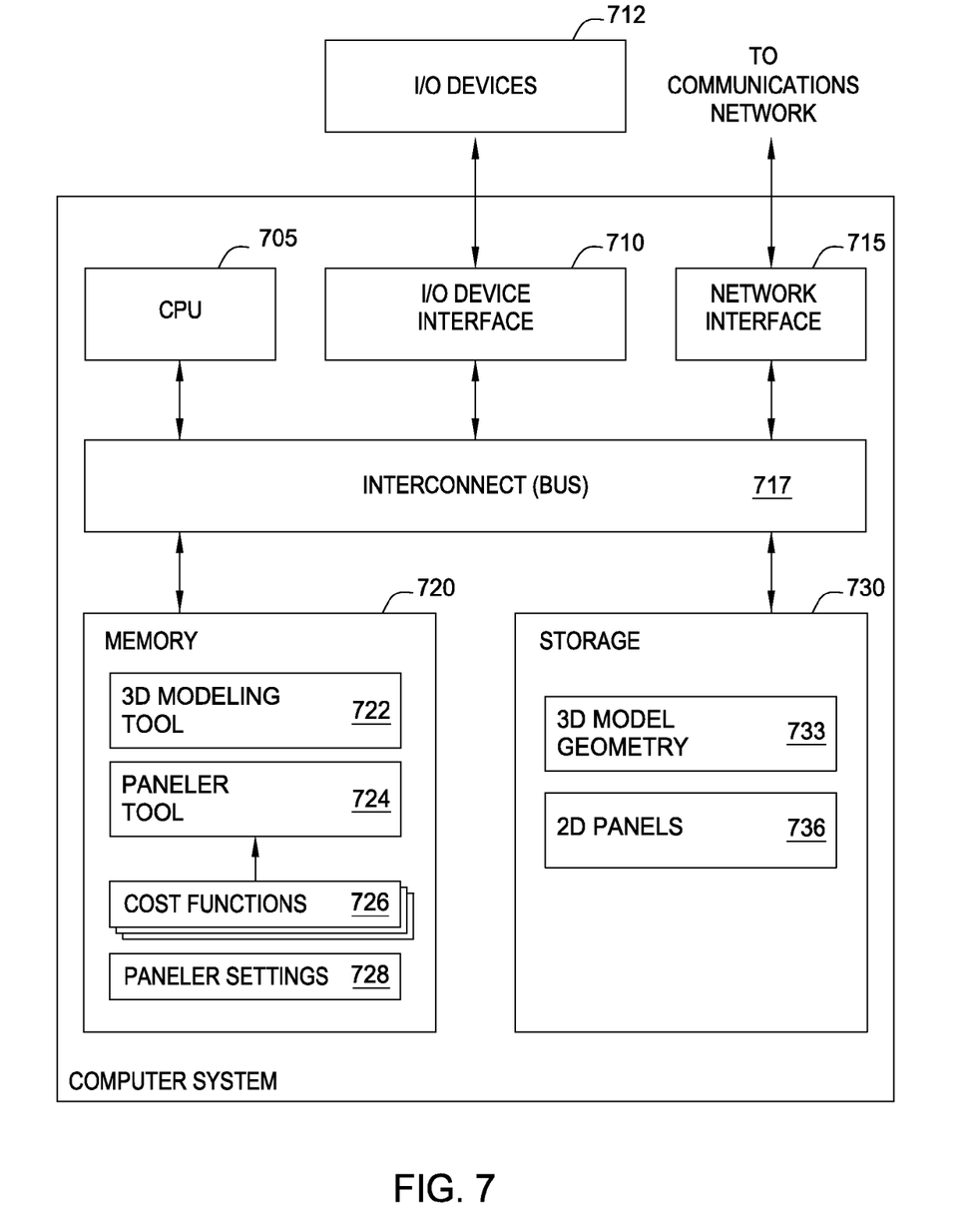
FIG. 7 illustrates an example computing system 700 used to decompose a 3D geometrical mesh into a set of 2D panels which encode the 3D geometry of the mesh, according to one embodiment of the invention.

FIG. 7 illustrates an example computing system 700 used to decompose a 3D geometrical mesh into a set of 2D panels which encode the 3D geometry of the mesh, according to one embodiment of the invention. As shown, the computing system 700 includes, without limitation, a central processing unit (CPU) 705, a network interface 715, a bus 717, a memory 720, and storage 730. The content server system 705 also includes an I/O device interface 710 to input/output devices 712 (e.g., keyboard, display and mouse devices).

CPU 705 retrieves and executes programming instructions stored in the memory 720. Similarly, CPU 705 stores and retrieves application data residing in the memory 720. The bus 717 is used to transmit programming instructions and application data between the CPU 705, I/O devices interface 710, storage 730, network interface 715, and memory 725. CPU 705 is included to be representative of a single CPU, multiple CPUs, a single CPU having multiple processing cores, and the like. And the memory 720 is generally included to be representative of a random access memory. The storage 730 may be a disk drive storage device. Although shown as a single unit, the storage 730 may be a combination of fixed and/or removable storage devices, such as magnetic disc drives, solid state drives (SSD), removable memory cards, optical storage, network attached storage (NAS), or storage volumes mounted over a storage area-network (SAN), etc.

Illustratively, the memory 720 includes a 3D modeling tool 722, a paneler tool 724, cost functions 726, and paneler settings 728. And storage 730 includes a set of 3D model geometry 733 and a collection of 2D panels decomposed from the 3D model geometry 733. 3D modeling tool 722 generally corresponds to a software application configured to allow users to compose graphical or vector models of 3D objects. The resulting 3D model geometry 733 may represent a given object as a mesh of triangles in a 3D coordinate space.

The paneler tool 724 may provide a software application configured to decompose the 3D model geometry into a set of 2D panels that automatically encodes the 3D geometry, as described relative to the method 200 shown in FIG. 2. For example, as described above, the paneler tool 724 may iteratively select elements of the 3D model geometry 733 to merge into panels and to represent each panel using a tree which encodes the geometry of the elements of 3D geometry merged into a given panel. Further, the paneler tool 724 may be configured to select elements of the 3D geometry for merging during the decomposition process based cost functions 726 that drive the decomposition process to favor panels having certain characteristics. Generally, the cost (or objective) functions 726 assign a real number to potential mergings panel based on measurable geometric properties of the panels (or based on other material or process contents relevant for a particular case). Doing so allows the "best" available merging to be made during each step of the iterative process. Once a 2D panelization is complete a "restart" approach may be used to improve the overall quality of that 2D panelization. Once panelized, the paneler tool 724 may be configured to generate encoded assembly instruction, as, as described relative to the method 500 shown in FIG. 5.

Paneler settings 728 may provide any tunable constraints related to creating a given 2D panelization. For example, in addition to filtering out potential panel mergings that cannot be flattened without overlapping or intersecting the panels, paneler settings 728 may specify constraints used to filter out potential panel mergings that cannot be physically realized using an intended material or construction process.

Advantageously, embodiments presented herein provide surfacing algorithms used to decompose three-dimensional (3D) geometry into an assemblable collection of two-dimensional (2D) panels. Importantly, the 3D geometry is automatically encoded into the panels, allowing the 3D geometry to be recreated simply by joining the panels at the appropriate seams and creating the appropriate bends/folds in each panel. Further, each panel has edges, vertices, and faces which can be algorithmically encoded in the panelization, allowing assembly instructions to be algorithmically generated that provide users with a step-by-step instructions carried out to realize the 3D geometry encoded in the 2D panels.

While the forgoing is directed to embodiments of the present disclosure, other and further embodiments of the disclosure may be devised without departing from the basic scope thereof. For example, aspects of the present disclosure may be implemented in hardware or software or in a combination of hardware and software. One embodiment of the disclosure may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the present disclosure, are embodiments of the present disclosure.

In view of the foregoing, the scope of the present disclosure is determined by the claims that follow.

We claim:

1. A computer-implemented method for processing three-dimensional (3D) model data that models an object, the method comprising:
    receiving, by a software application stored in a memory and executed on a processor, a set of 3D geometry elements that model the object, wherein the 3D geometry elements comprise a mesh of triangles within a 3D coordinate space; and
    decomposing the 3D geometry elements into a collection of one or more two-dimensional (2D) panels, wherein each 2D panel encodes a distinct portion of the 3D model data of the object, wherein decomposing the 3D geometry elements into the collection of one or more 2D panels comprises:
        initializing the 2D panels such that each 2D panel is one of the triangles in the mesh of triangles; and
        iteratively:
            identifying one or more potential mergings of pairs of 2D panels that share common edges in the 3D geometry,
            for each potential merging in the one or more potential mergings:
                evaluating a function that assigns a number to the potential merging based on geometric properties of a 2D panel that would result from the potential merging, and
                selecting one potential merging from the one or more potential mergings based on the assigned numbers,
            until termination criteria are satisfied.

2. The method of claim 1, wherein the function is one of a cost function and an objective function.

3. The method of claim 1, further comprising, prior to evaluating the one or more potential mergings, filtering the one or more potential mergings to remove potential mergings that cannot be projected into a 2D plane without overlapping or intersecting itself.

4. The method of claim 1, further comprising, prior to evaluating the one or more potential mergings, filtering the one or more potential mergings to remove potential mergings according to a material or manufacturing constraint.

5. The method of claim 1, wherein each 2D panel encodes the distinct portion of the 3D model data of the object as a tree, each node of the tree corresponds to a center of one of the triangles merged into that 2D panel, and each branch of the tree connects the centers of two adjacent triangles merged into that 2D panel.

6. The method of claim 5, further comprising, traversing the tree to generate step-by-step instructions for assembling the 2D panels to realize a 3D model of the object.

7. A non-transitory computer-readable storage medium storing code for execution by a processor, wherein the code, when executed, performs an operation for processing three-dimensional (3D) model data that models an object, the operation comprising:
    receiving a set of 3D geometry elements that model the object, wherein the 3D geometry elements comprise a mesh of triangles within a 3D coordinate space; and
    decomposing the 3D geometry elements into a collection of one or more two-dimensional (2D) panels, wherein each 2D panel encodes a distinct portion of the 3D model data of the object, wherein decomposing the 3D geometry elements into the collection of one or more 2D panels comprises:
        initializing the 2D panels such that each 2D panel is one of the triangles in the mesh of triangles; and
        iteratively:
            identifying one or more potential mergings of pairs of 2D panels that share common edges in the 3D geometry,
            for each potential merging in the one or more potential mergings:

evaluating a function that assigns a number to the potential merging based on geometric properties of a 2D panel that would result from the potential merging, and selecting one potential merging from the one or more potential mergings based on the assigned numbers, until termination criteria are satisfied.

8. The computer-readable storage medium of claim 7, wherein the function is one of a cost function and an objective function.

9. The computer-readable storage medium of claim 7, wherein the operation further comprises, prior to evaluating the one or more potential mergings, filtering the one or more potential mergings to remove potential mergings that cannot be projected into a 2D plane without overlapping or intersecting itself.

10. The computer-readable storage medium of claim 7, wherein the operation further comprises, prior to evaluating the one or more potential mergings, filtering the one or more potential mergings to remove potential mergings according to a material or manufacturing constraint.

11. The computer-readable storage medium of claim 7, wherein each 2D panel encodes the distinct portion of the 3D model data of the object as a tree, each node of the tree corresponds to a center of one of the triangles merged into that 2D panel, and each branch of the tree connects centers of two adjacent triangles merged into that 2D panel.

12. The computer-readable storage medium of claim 11, wherein the method further comprises, traversing the tree to generate step-by-step instructions for assembling the 2D panels to realize a 3D model of the object.

13. A system, comprising:

a memory; and a processor storing one or more applications, which, when executed on the processor, perform an operation for processing three-dimensional (3D) model data that models an object, the operation comprising:

receiving, by a software application stored in a memory and executed on a processor, a set of 3D geometry elements that model the object, wherein the 3D geometry elements comprise a mesh of triangles within a 3D coordinate space, and decomposing the 3D geometry elements into a collection of one or more two-dimensional (2D) panels, wherein each 2D panel encodes a distinct portion of the 3D model data of the object, wherein decomposing the 3D geometry elements into the collection of one or more 2D panels comprises:

representing each triangle in the mesh of triangles as a different 2D panel; and iteratively:

identifying one or more potential mergings of pairs of 2D panels that share common edges in the 3D geometry, for each potential merging in the one or more potential mergings:

evaluating a function that assigns a number to the potential merging based on geometric properties of a 2D panel that would result from the potential merging, and selecting one potential merging from the one or more potential mergings based on the assigned numbers, until termination criteria are satisfied.

14. The system of claim 13, wherein the function is one of a cost function and an objective function.

15. The system of claim 13, wherein the operation further comprises, prior to evaluating the one or more potential mergings, filtering the one or more potential mergings to remove potential mergings that cannot be projected into a 2D plane without overlapping or intersecting itself.

16. The system of claim 13, wherein the operation further comprises, prior to evaluating the one or more potential mergings, filtering the one or more potential mergings to remove potential mergings according to a material or manufacturing constraint.

17. The system of claim 13, wherein each 2D panel encodes the distinct portion of the 3D model data of the object as a tree, each node of the tree corresponds to a center of one of the triangles merged into that 2D panel, and each branch of the tree connects centers of two adjacent triangles merged into that 2D panel.

18. The system of claim 17, wherein the method further comprises, traversing the tree to generate step-by-step instructions for assembling the 2D panels to realize a 3D model of the object.

* * * * *